(12) United States Patent  
Becker et al.

(10) Patent No.: US 7,113,401 B2
(45) Date of Patent: Sep. 26, 2006

(54) SYSTEM FOR AIRFLOW MANAGEMENT IN ELECTRONIC ENCLOSURES

(75) Inventors: Wiren D. Becker, Hyde Park, NY (US); Joseph P. Corrado, Marlboro, NY (US); Ethan E. Cruz, LaGrangeville, NY (US); Michael J. Fisher, Poughkeepsie, NY (US); Gary F. Goth, Pleasant Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 68 days.

(21) Appl. No.: 10/972,868

(22) Filed: Oct. 25, 2004

(65) Prior Publication Data

US 2006/0087813 A1 Apr. 27, 2006

(51) Int. Cl.
*H05K 7/20* (2006.01)
(52) U.S. Cl. ............... 361/694; 361/690; 361/687; 361/695; 165/122; 454/184
(58) Field of Classification Search ........ 361/687–690, 361/692–695, 719, 721–727, 729, 736, 741, 361/756, 784; 174/16.1, 16.3, 252; 165/80.3, 165/104.33, 122; 454/184; 312/223.2; 211/41.17, 211/26, 26.2
See application file for complete search history.

(56) References Cited

U.S. PATENT DOCUMENTS

| | | | |
|---|---|---|---|
| 4,860,163 A * | 8/1989 | Sarath .................... 361/695 |
| 5,535,099 A | 7/1996 | McCarthy et al. .......... 361/800 |
| 5,740,018 A | 4/1998 | Rumbut, Jr. ................ 361/720 |
| 5,875,097 A | 2/1999 | Amaro et al. ............... 361/704 |
| 5,886,872 A | 3/1999 | Koenen et al. ............. 361/719 |
| 5,946,189 A | 8/1999 | Koenen et al. ............. 361/698 |
| 6,008,991 A | 12/1999 | Hawthorne et al. ........ 361/707 |
| 6,047,836 A * | 4/2000 | Miles ...................... 211/41.17 |
| 6,621,706 B1 | 9/2003 | Tzlil et al. .................. 361/719 |
| 6,674,643 B1 | 1/2004 | Centola et al. ............. 361/720 |
| 6,690,575 B1 * | 2/2004 | Banton et al. .............. 361/690 |
| 6,927,975 B1 * | 8/2005 | Crippen et al. ............. 361/687 |
| 2002/0012235 A1 | 1/2002 | Kupnicki et al. ........... 361/785 |
| 2002/0186544 A1 | 12/2002 | Tzlil et al. .................. 361/719 |
| 2003/0030986 A1 | 2/2003 | Centola et al. ............. 361/720 |
| 2003/0223197 A1 | 12/2003 | Hulan et al. ............... 361/719 |

* cited by examiner

*Primary Examiner*—Michael Datskovskiy
(74) *Attorney, Agent, or Firm*—Lilly Neff; Cantor Colburn LLP

(57) ABSTRACT

A system for airflow management in an electronic enclosure includes a backplane assembly having at least one backplane connector, at least one daughter card, and components disposed on the daughter card oriented to facilitate front-to-back airflow, wherein inlet cooling air impinges on the backplane assembly and splits into at least two flow portions flowing in different directions along a surface defining the backplane assembly

27 Claims, 12 Drawing Sheets

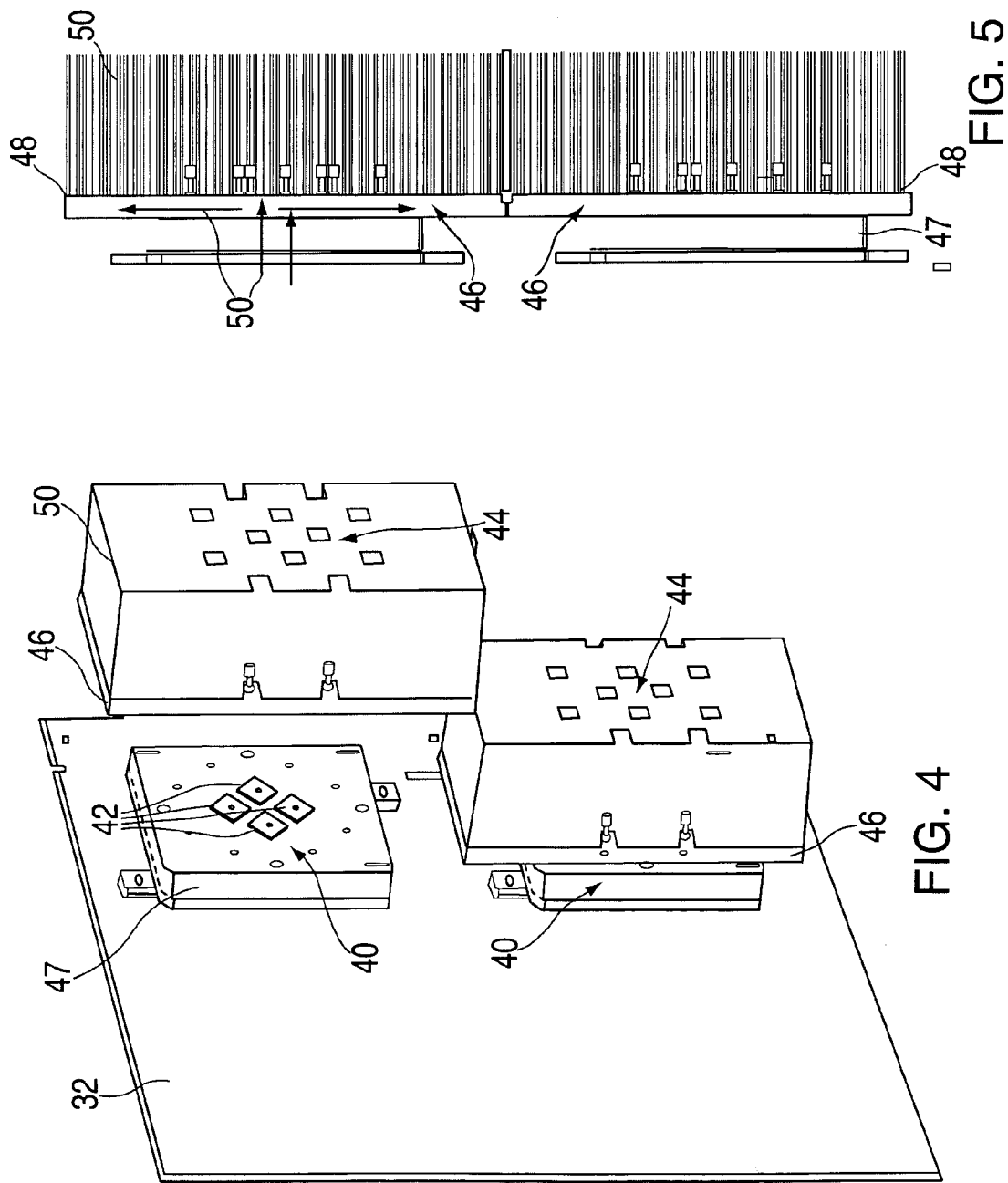

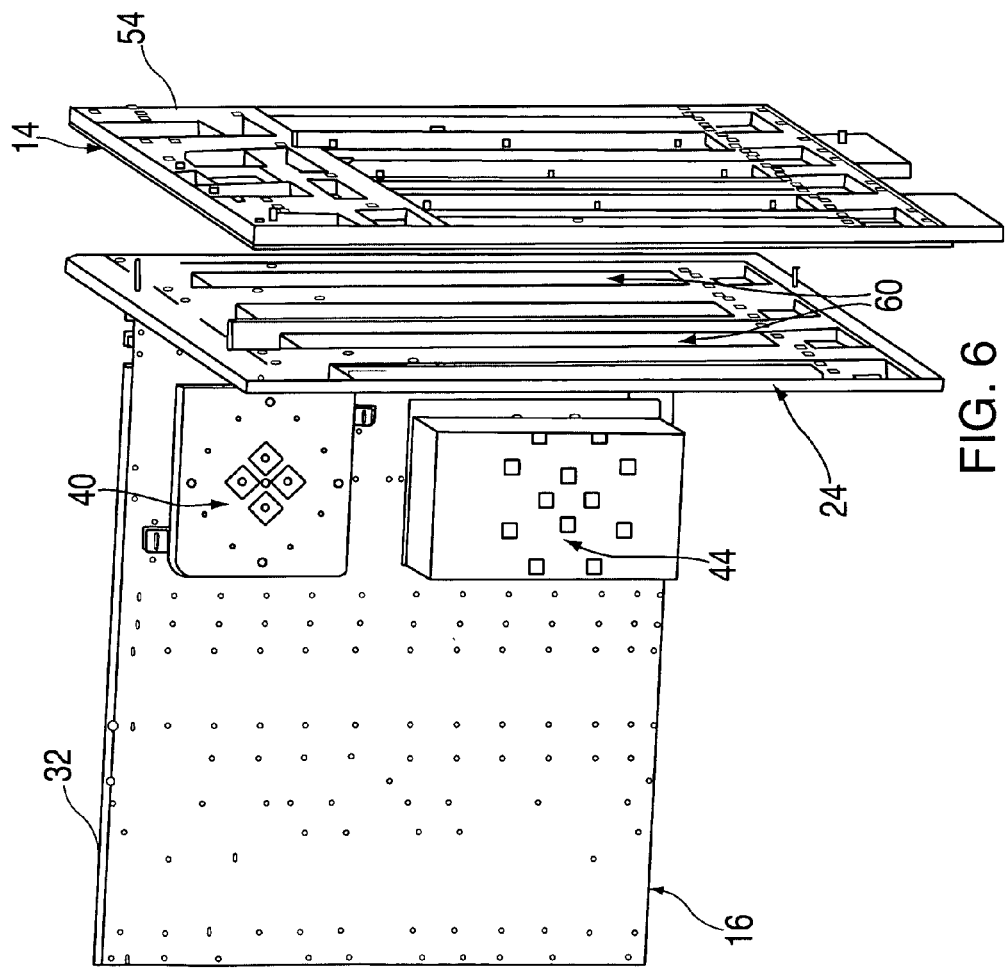
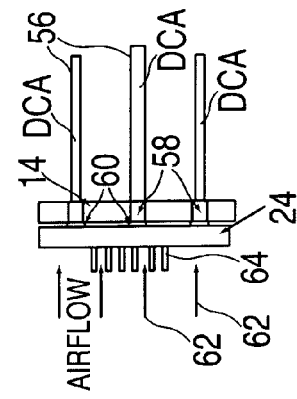
FIG. 6
FIG. 7

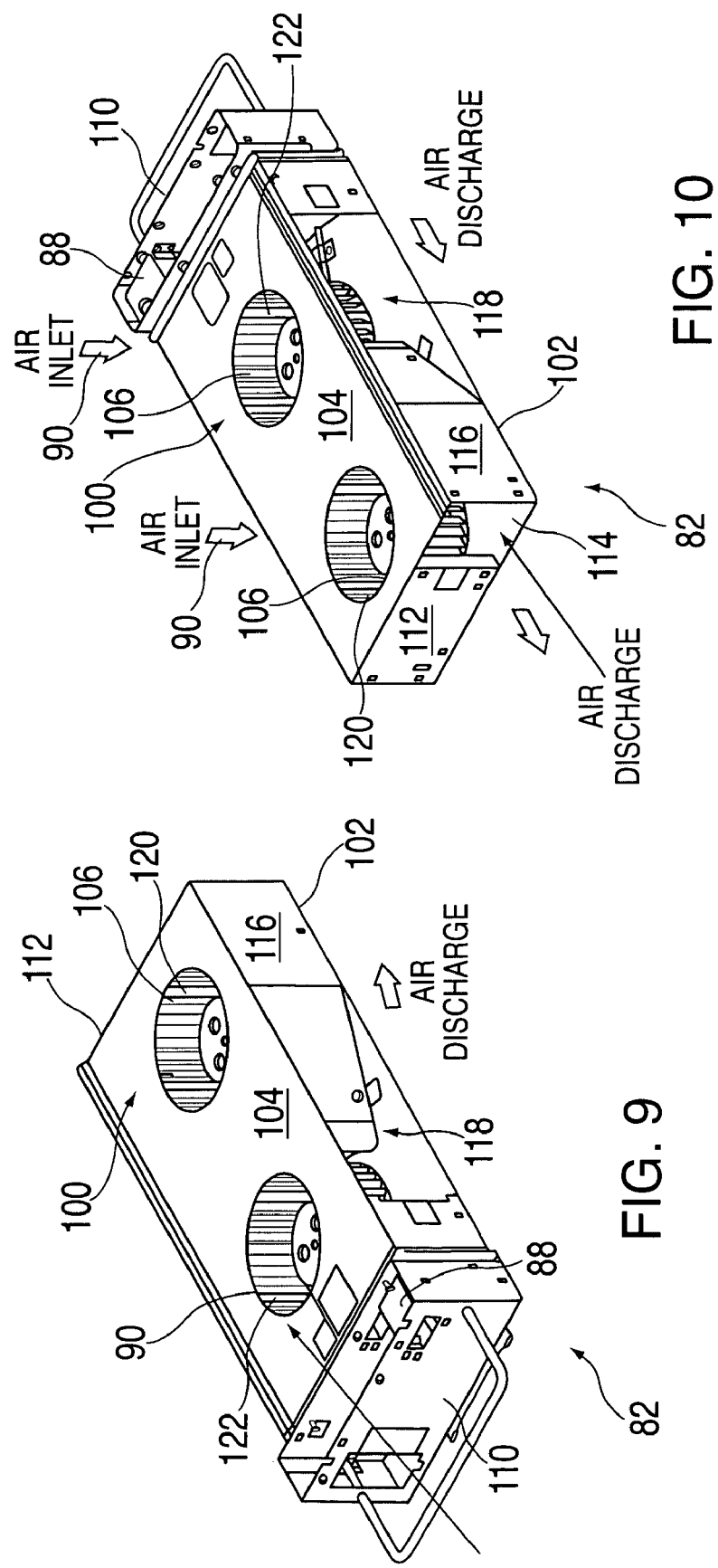

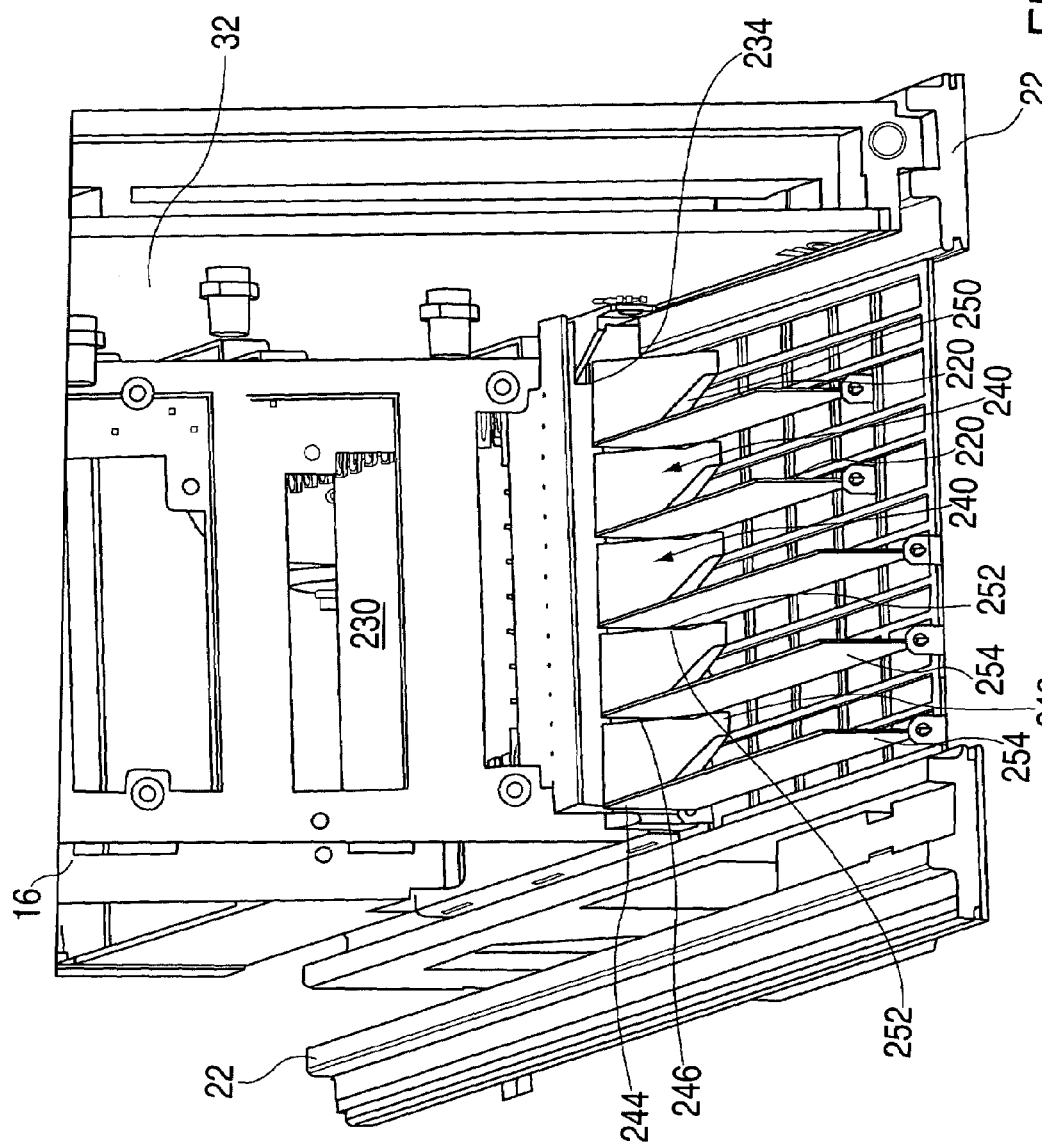

SYSTEM FOR AIRFLOW MANAGEMENT IN ELECTRONIC ENCLOSURES

BACKGROUND OF THE INVENTION

Computers are customarily provided with computer cage structures, which may comprise a sheet metal framework and which may contain a backplane. A backplane is a circuit board (e.g., mother card) or framework that supports other circuit boards, devices, and the interconnections among devices, and provides power and data signals to supported devices. The mother card may be the main circuit card in the computer, which may interconnect additional logical cards and assemblies. The computer cage structure is adapted to receive and removably support at least one and preferably a plurality of options or daughter cards (blades or nodes) which when operatively installed in their associated cage structure, upgrade the operating capabilities of the computer. For example, it is known to place an assembly, including a backplane and various circuit boards, such as a processor card, an input-output card and a so-called memory riser card, within an open cage. This forms a so-called central electronics complex (CEC) or cage of a computer system. The cage is subsequently fixed within a computer housing.

A standard containing enclosure or cage protects the mother card and individual daughter cards and facilitates the easy insertion and removal of the daughter cards from a mother card (mother board) or backplane slot. These daughter cards may be installed in the computer during the original manufacture of the computer and or subsequently installed by the computer purchaser. The cage serves to position and mechanically support the circuit boards within the computer housing, and acts as an electromagnetic compatible (EMC) shield. An EMC shield allows operation in an electromagnetic environment at an optimal level of efficiency, and allows static charges to be drained to a frame ground. Moreover, the cage helps to protect the components contained therein from environmental damage, for example, vibrations, which could cause the components to fail.

Additionally, the cage is typically fixed within a so-called system chassis, which is a frame that provides further support for the cage, and which is removably stacked upon other system chassises within a system rack. The chassis may contain other components and sub-systems, such as power supplies and cooling fans, for example, which are connected to the components within the cage using cables, for instance.

A daughter card may include a relatively small rectangular printed circuit having a connecter along one side edge. A 20"×24" node or server may weigh over a hundred pounds, for example. The mother card or system backplane slot has an electrical connector. The daughter card connector plugs into a corresponding electrical connector of the mother card to operatively couple the daughter card to the mother card or system backplane slot. In order to allow the circuit boards or daughter cards to be connected to the backplane, it is also typical to position the backplane at a middle of the cage, and in a vertical position. This allows the circuit boards or daughter cards to be plugged into the card slots of the backplane through the open front, for example, of the cage.

Data processing systems in general and server-class systems in particular are frequently implemented with a server chassis or cabinet having a plurality of racks. ach cabinet rack can hold a rack mounted device (e.g., a daughter card, also referred to herein as a node, blade or server blade) on which one or more general purpose processors and/or memory devices are attached. The racks are vertically spaced within the cabinet according to an industry standard displacement (the "U"). Cabinets and racks are characterized in terms of this dimension such that, for example, a 42U cabinet is capable of receiving 42 1U rack-mounted devices, 21 2U devices, and so forth. Dense server designs are also becoming available, which allow a server chassis to be inserted into a cabinet rack, thus allowing greater densities than one server per 1U. To achieve these greater densities, the server chassis may provide shared components, such as power supplies, fans, or media access devices which can be shared among all of the blades in the server blade chassis.

Problems have arisen, for example, with the advent of employing daughter cards such as the large massive Processor-Memory cards. Recent system architectures have migrated to using multiples of these large cards (parallel to each other) installed in a vertical orientation and perpendicular to the CEC motherboard. However, inherent in such an architecture are difficulties in cooling these cards and CEC board.

For example, with the advent of multichip modules (MCMs), containing multiple integrated circuit (IC) chips each having many thousands of circuit elements, it has become possible to pack great numbers of electronic components together within a very small volume. As is well known, ICs generate significant amounts of heat during the course of their normal operation. Since most semiconductor or other solid state devices are sensitive to excessive temperatures, a solution to the problem of the generation of heat by IC chips in close proximity to one another in MCMs is of continuing concern to the industry.

Current state-of-art cooling requires either staggering the MCMS away from the midplane connector if air cooled or using water or refrigerant cooling when the MCMs are optionally placed next to the midplane. Air cooling multiple high powered MCMs in series along the midplane is ineffective due to air temperature rise and serial airflow impedances.

Since high-end server performance often requires placing numerous high powered logic modules in close proximity to a common vertical midplane, prior art central electronic complexes (CECs) have been unable to be air cooled in such an arrangement due to an inability of removing heat by serial airflow through these logic modules or MCMs.

Secondly, and perhaps more critical to server performance, as the logic voltage drops with new chip generations, higher currents and $I^2R$ losses result. In particular, the printed circuit board midplane that delivers the power from power supplies to the logic modules and interconnects can generate 1000 watts to 2000 watts due to high currents and $I^2R$ losses. With low voltages in new CMOS, the currents are increasing dramatically. These currents are carried from the power supplies through the midplanes that interconnect the nodes. Even if prior art water or refrigeration cooling is used on the logic modules, such cooling is unable to cool more than 200 to 300 watts effectively as the conductive thermal path from the power planes to the aluminum stiffener and the convective performance of the stiffener are both limited.

Prior art midplanes have been cooled by airflow flowing over the stiffener parallel to the midplane. Midplane heat is removed via conduction through the insulative epoxy glass where the stiffener may contact the electrically isolated epoxy glass. Unfortunately, because of the insulative properties of the epoxy glass, this approach works for only about 200 watts or at most 300 watts under most reasonable airflows and temperature specifications.

For the foregoing reasons, therefore, there is a need for enabling significantly higher heat loads of logic, I/O memory, and power supplies. Further, there is a need to more efficiently cool the components of the CEC with a symmetrical, balanced airflow through the various nodes to support higher generated power and which enables low temperature specifications on components placed at the logical end of heated exhaust air.

SUMMARY OF THE INVENTION

The disclosed embodiments relate to a system for airflow management in an electronic enclosure including: a backplane assembly, the backplane assembly including at least one backplane connector; at least one daughter card and components disposed on the daughter card oriented to facilitate front-to-back airflow, wherein inlet cooling air impinges on the backplane assembly and splits into at least two flow portions flowing in different directions along a surface defining the backplane assembly. The daughter card includes a daughter card connector configured to be removably connectable to the backplane connector. The daughter card is oriented substantially perpendicular to the backplane assembly so that cooling air flows substantially parallel to the daughter card.

In addition, the disclosed embodiments relate to central electronics complex including an enclosure and a backplane assembly vertically disposed within the enclosure and having at least one backplane connector. At least one daughter card includes a daughter card connector configured to be removably connectable to the backplane connector. The daughter card is oriented substantially perpendicular to the backplane assembly so that cooling air flows substantially parallel to the daughter card. At least one guide rail extends from the backplane assembly for operable communication with the enclosure. The guide rail facilitates installation and removal of the daughter card. Components disposed on the daughter card are oriented to facilitate front-to-back airflow, wherein inlet cooling air impinges on the backplane assembly and splits into at least two flow portions flowing in different directions along a surface defining the backplane assembly.

The disclosed embodiments also relate to an airflow management system for a computer. The system includes a frame; a central electronics complex enclosure housed within the frame; a backplane assembly vertically disposed within the enclosure; multiple daughter cards; at least one guide rail extending from the backplane; and components disposed on each daughter card oriented to facilitate front-to-back airflow, wherein inlet cooling air impinges on the backplane assembly and splits into at least two flow portions flowing in different directions along a surface defining the backplane assembly. The backplane assembly includes at least one backplane connector. Each daughter card includes a daughter card connector configured to be removably connectable to the backplane connector and is oriented substantially perpendicular to the backplane assembly so that cooling air flows substantially parallel to each daughter card. The at least one guide rail facilitates installation and removal of each daughter card.

BRIEF DESCRIPTION OF THE DRAWINGS

Referring now to the exemplary drawings wherein like elements are numbered alike in the several FIGURES:

FIG. 4 is a perspective view of a printed circuit board or node card of FIG. 3 illustrating two multi-chip modules (MCMs) and corresponding heat sink assemblies;

FIG. 5 is a side view of the MCMs and corresponding heat sink assemblies of FIG. 4 illustrating heat flux with respect to the upper MCM;

FIG. 6 is a perspective view of the node card of FIG. 4 perpendicularly disposed with a backplane assembly illustrating thermal pads intermediate a motherboard and an aluminum front stiffener;

FIG. 7 is a partial schematic top view of a node card and power planes in thermal communication with the backplane assembly of FIG. 6;

FIG. 9 is a perspective view of a dual blower assembly for a right side of a CEC or cage illustrating a pair of inlets and a side exhaust opening;

FIG. 10 is a perspective view of a dual blower assembly for a left side of the CEC illustrating two inlets, a side exhaust opening and a back exhaust opening;

FIG. 15 is a rear perspective of one set of node actuated lovers in the open position illustrating mechanical cooperation with corresponding fingers extending from a front leading edge of a node.

DETAILED DESCRIPTION OF THE PREFERRED EMBODIMENTS

The invention will now be described in more detail by way of example with reference to the embodiments shown in the accompanying figures. It should be kept in mind that the following described embodiments are only presented by way of example and should not be construed as limiting the inventive concept to any particular physical configuration.

Further, if used and unless otherwise stated, the terms "upper", "lower", "front", "back", "over", "under", and similar such terms are not to be construed as limiting the invention to a particular orientation. Instead, these terms are used only on a relative basis. For the purposes of the present disclosure, the terms printed circuit board (PCB) and printed wire board (PWB) are equivalent terms.

Figure 1:
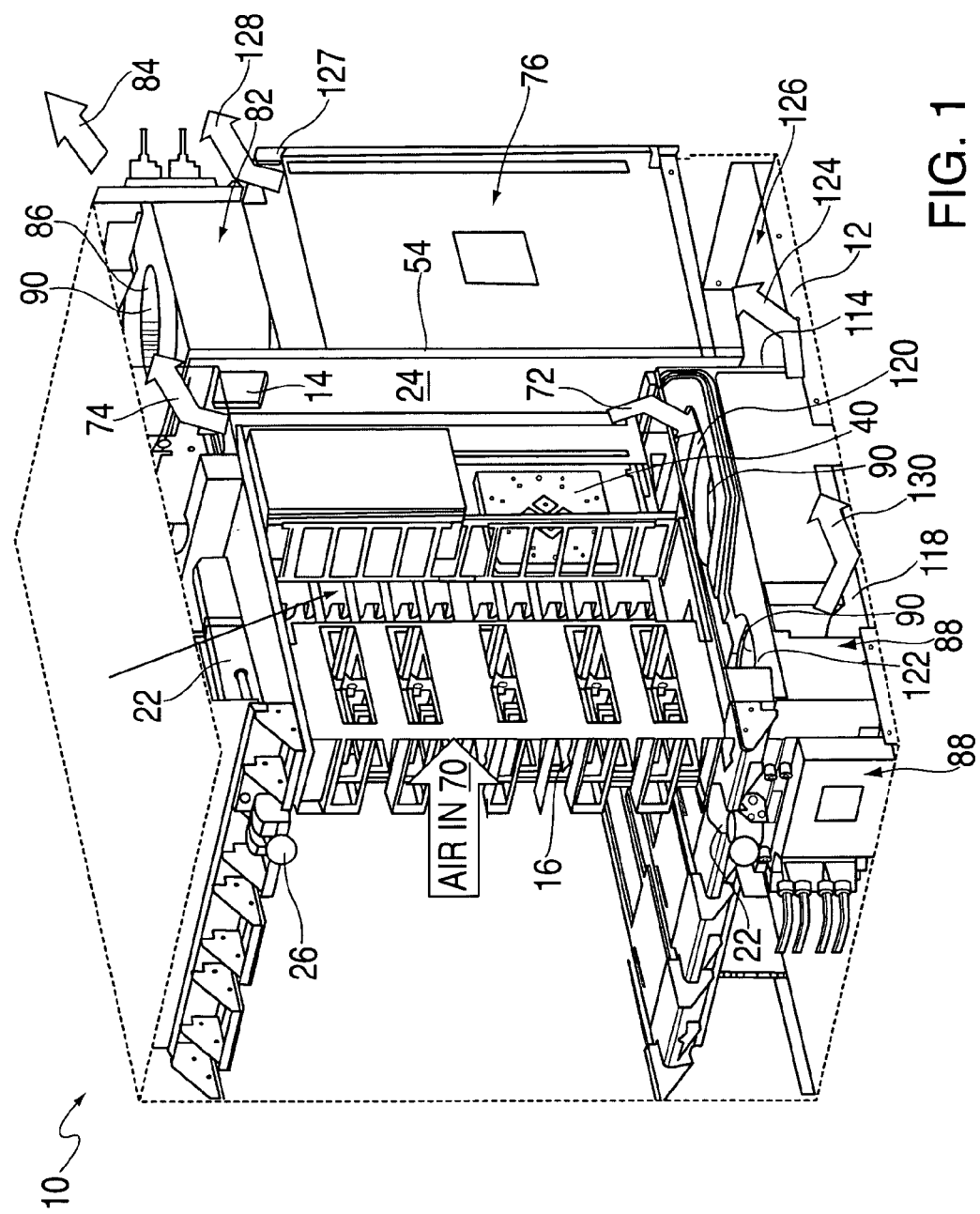
FIG. 1 is a perspective view of a multiple card enclosure illustrating one daughter card enclosure interfacing with a backplane or midplane.
Figure 2:
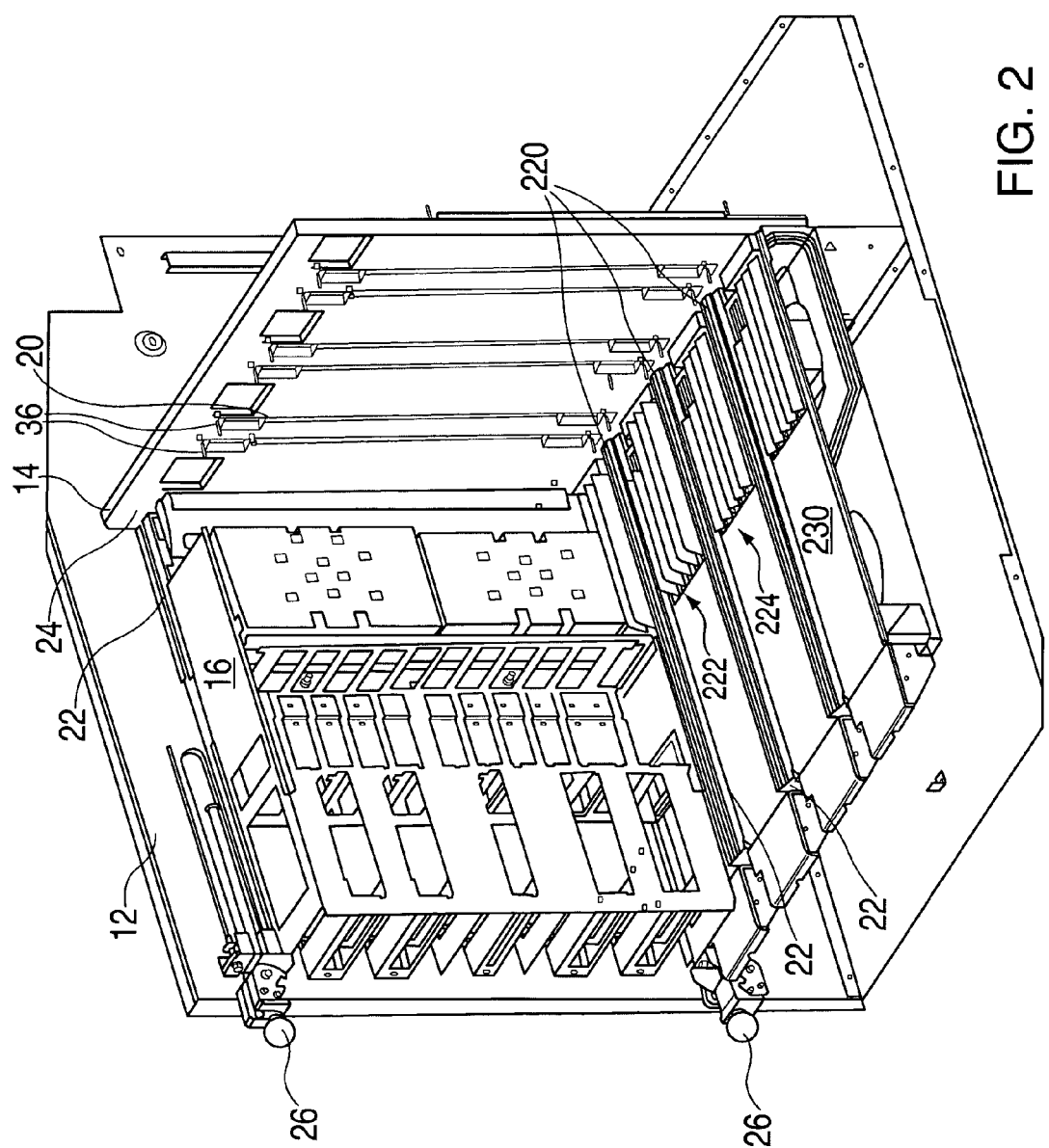
FIG. 2 is a perspective view of the multiple card enclosure of FIG. 1 with a portion of the enclosure removed illustrating node actuated louvers aligned with each card slot.

FIGS. 1 and 2 illustrate an exemplary embodiment of the invention, which includes a so-called central electronics complex 10 (CEC) of a computer system. The CEC 10 is comprised of an enclosure (such as a cage 12), a backplane or midplane 14 as illustrated, and a circuit board or daughter card, generally known as a blade or node, and may be more specifically a processor card assembly 16.

The cage 12 is dimensioned to accommodate the backplane 14 and a plurality of daughter cards 16. Moreover, the cage 12 is preferably comprised of sheet metal, which can be easily manipulated to form the walls of the cage 12, although other materials, such as plastic, may also be used. However, it is preferable that the material used to form the cage 12 be conductive, so that the cage can serve as an EMC shield.

As best shown with reference to both FIG. 1 and FIG. 2, the backplane or midplane 14 is a generally planar, rectangular structure, and is accommodated within the cage 12 so that its major surfaces are substantially vertical and essentially perpendicular to the walls of the cage.

Each daughter card 16 is generally planar, rectangular structure, with a length that is substantially the same as its height, as illustrated, but not limited thereto. As previously mentioned, the cage 12 can then be advantageously tailored in the same manner (with a length that is about the same as its height), so as to receive the respective cards 16 therein with a minimum amount of wasted space.

When installed in the cage 12, the cards 16 are essentially parallel to each other, and essentially perpendicular to the major surfaces of the backplane 14. However, other orientations may be possible, within the scope of the present invention.

The daughter card 16 is preferably removably coupled to the backplane 14 by inserting a known corresponding plug connector 18, such as a single row or a dual row of full edge length very high density metric interconnector (VHDM) (not shown in FIGS. 1 and 2, but shown in FIG. 3) on the respective card into an associated backplane card slot 20 (FIG. 2). However, other suitably configured plug connectors are contemplated and are not limited to a VHDM. As will be appreciated, since the cage 12 is open at its front, each card 16 is inserted through the open front and moved in a horizontal direction until the cards engage with associated card slots 20 and power interconnects to be discussed more fully below.

As illustrated in FIGS. 1 and 2, the backplane 14 is adapted to receive and electrically interconnect a plurality of daughter cards 16. For example, the illustrated backplane 14 is adapted to receive four cards 16.

Although the present embodiment has been described in connection with a daughter card 16 such as a processor card assembly, it is contemplated that the same inventive scheme can be utilized with other types of circuit boards. Moreover, it is also contemplated that the respective cards may be specifically tailored for use with the cage 12. For example, in the above-described exemplary embodiment, the plug connector of the daughter card is disposed symmetrically, that is, along a full length of the edge of the card.

As will be appreciated, since the cards 16 may be modified by the user, it is advantageous if the cards be easily accessible. As previously discussed, each card is accessed through the open front of the cage 12. Conventionally, the cages are each positioned within a respective chassis, each having an air plenum above the daughter cards for inlet and exhaust purposes, with the respective chassises and cages being stacked upon each other.

As shown in FIGS. 1 and 2, in order to facilitate the installation and removal of the card 16 from the cage 12, the card is advantageously slidably disposed on at least two guide rails 22 which may be operably connected to wall 24 of cage 12 in an upper and lower configuration, for example, and registered to backplane 14. In exemplary embodiments as shown, wall 24 is a midplane stiffener. Thus, when it is desired to install a card 16, the card 16 is simply slid in a horizontal direction into cage 12. The guide rail 22 may comprise a non-conductive material such as plastic. In addition, the guide rail may also comprise surface treated metals, such as nickel-plated steels for instance. The guide rail 22 assists in guiding and aligning the daughter card 16 to the backplane 14.

The daughter card 16 may have at least one latch 26. The latch 26 may be configured to lock the daughter card 16 into place once the daughter card is in operable communication with the backplane 14. A handle 28 (FIG. 8) is optionally included to allow easier installation for large and massive daughter cards 16, for example some processor card assemblies may weigh in excess of 70 pounds.

Figure 3:
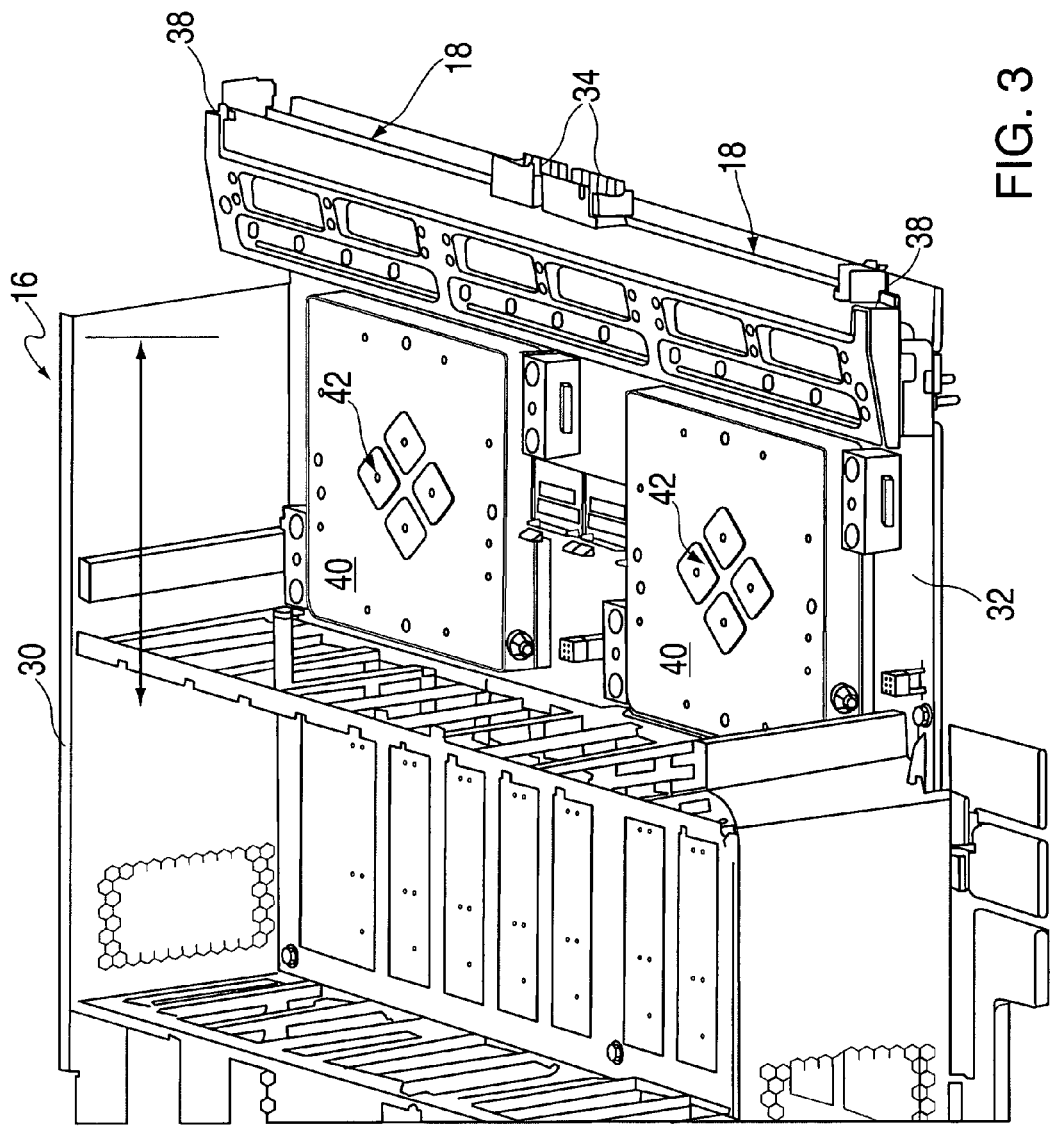
FIG. 3 is a partial perspective view of the daughter card of FIGS. 1 and 2 illustrating a VHDM interconnector for connecting the daughter card to the backplane.

Referring now to FIG. 3, a partial view of a daughter card 16 is shown removed from the CEC 10. The daughter card 16 removed from a backplane 14, which may also be a mother card, or midplane includes a daughter card enclosure 30 housing a node board 32. The mother card 14 may have at least one VHDM power module (not shown) which is connectable to at least one VHDM power connector 18 located on the daughter card 16. The mother card 14 may also have at least one VHDM signal connector (also not shown) located on the backplane 14 which is connectable to at least one VHDM signal wafer 34 located on the daughter card 16. The backplane may have at least two guide pins 36 (FIG. 2) which is engageable with at least two guide pin holes 38 located on the daughter card 16, the at least two guide pins 36 and at least two guide pin holes 38 may be arranged in an upper and lower configuration. In the configuration shown in FIGS. 1 and 2, the front end of the daughter card 16 is on the left side as illustrated, and the rear end of the daughter card 16 is on the right side.

Still referring to FIG. 3, node board 32 is a printed circuit board having two multichip modules (MCMs) 40 disposed thereon and proximate connector 18 and midplane 14 when installed to shorten line lengths therebetween. Each MCM 40 includes multiple chips indicated generally at 42. The MCMs are placed adjacent to the midplane to minimize line lengths or interconnect lengths between MCMs on different node boards 32.

Referring now to FIGS. 4 and 5, each MCM 40 includes a corresponding vapor chamber heat sink assembly 44 disposed over each MCM 40. A vapor chamber 46 includes a first surface in thermal communication with a cap 47 defining MCM 40 while an opposite surface is in thermal communication with a base 48 of a finned heat sink 50. Each vapor chamber 46 contains a heat transfer fluid such as, water, freon or glycol, for example. It will be recognized by one skilled in the pertinent art that having vapor chamber 46 extending well beyond the confines of cap 47 enables the vapor chambers to spread the heat well beyond the confines of the cap of a module (e.g., lid or cap 47). In an exemplary embodiment depicted in FIG. 5, a width of the heat sink vapor chambers are about twice the width of lid 47 allowing heat flux generated by chips 42 to flow as indicated generally by arrows 50 in FIG. 5. Moreover, it should be noted that a width of each of the heat sink assemblies 44 is sized to offset airflow inequalities discussed more fully herein. For example, a lower heat sink assembly 44 as illustrated can be made smaller if a majority of air flows therethrough compared to the upper heat sink assembly.

Referring now to FIG. 6, the node board or PCB 32 having two MCMs is shown with wall 24 or front stiffener 24 separated from midplane 14. A front surface of midplane 14 is in thermal communication with a back surface of front stiffener 24, while an opposite back surface of midplane 14 is in thermal communication with a midplane board rear stiffener 54.

Referring to FIGS. 6 and 7, rear stiffener 54 provides a thermal path from buried copper power planes 56 to the thermally conductive front stiffener 24 by extracting heat through a backside of power pins 58 (FIG. 7). A rear side of the front stiffener 24 that contacts the midplane board's epoxy glass has grooves (not shown) suitably placed over each connector row to receive a thermally conductive pad 60 disposed between the front stiffener 24 and backside of the pins 58 used to electrically connect or plug into a corresponding power supply. The pins 58 provide a low resistance thermal path from midplane power planes 56 and from direct current assembly (DCA) connectors or pins 58 where heat is generated. The thermally conductive pads 60 are located to contact the backside of power pins 58 (e.g., plated through holes (PTHs)) such that they have a low thermal impedance to the copper power planes 56 in the midplane where heat is generated by high midplane currents powering logic nodes 16. Once the heat generated from the power planes 56 and DCA connectors 58 is thermally conducted to the front stiffener 24, heat is conducted through the stiffener 24 and spread out on an opposite surface thereof allowing impingement cooling with impinging airflow indicated with arrows 62 allowing convection therefrom. In an exemplary embodiment, an opposite surface of front stiffener 24 is populated with impingement fins 64 (e.g. round or square, not shown) to enhance the surface area for the impinging airflow to convect from. In an exemplary embodiment, rear stiffener is cast aluminum, but may be machined for lower volumes.

In an alternative embodiment, stiffener 24 is optionally absent if a zero insertion force (ZIF) socket is used for the system board 14. In this case, it is contemplated that airflow 70 impinges directly on backplane 14.

Figure 8:
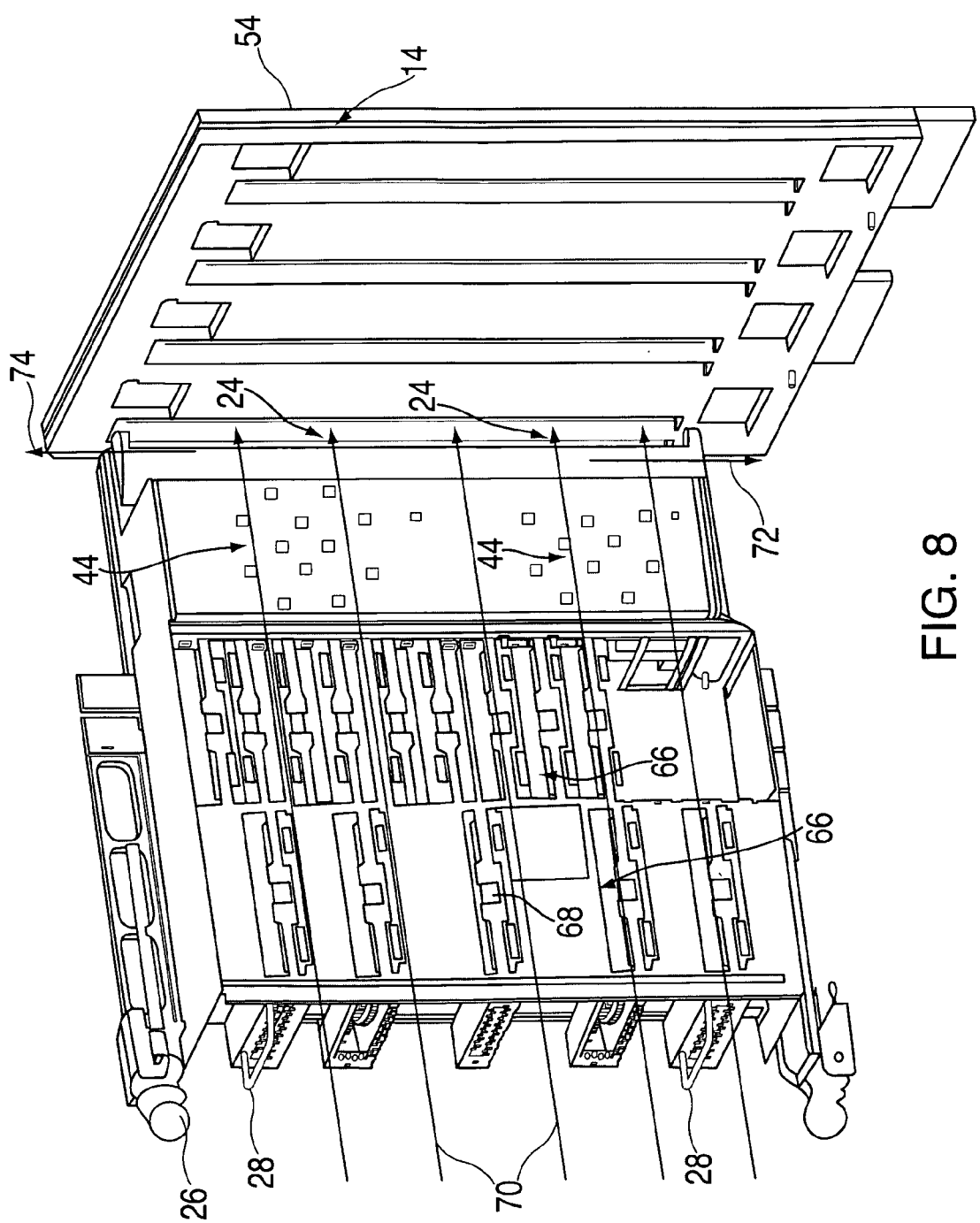
FIG. 8 is a perspective view of a daughter card connected to the backplane assembly illustrating inlet airflow being split upon impingement with the front stiffener of the backplane assembly.

Referring now to FIGS. 1 and 8, a circuit board or daughter card, such as blade or node 16 is illustrated having two processor multi-chip modules (MCM) 40, and a corresponding vapor chamber heat sink assembly 44 (only one shown in FIG. 1 for sake of clarity) disposed over each MCM 40, 256 GB memory 66, an input/output (I/O) card (not shown), and a control multiplexer card 68, for example, attachable to the backplane 14. Air inlets, such as those entered by horizontal airflow 70 are shown at a front of CEC 10 and air flows across fins 50 of heat sink assembly 44 and impinges on front stiffener 24. After impingement of air flow on front stiffener 24 substantially normal thereto, airflow splits to a lower and upper portions of CEC 10 indicated generally with arrows 72, and 74, respectively. In this manner, the horizontal layout of memory, I/O, and processor modules are air cooled in parallel with horizontal airflow 70. The MCMs 40 contain numerous high power processor and support logic chips and are cooled using fully parallel airflow such that no MCM 40 uses preheated exhaust air from another MCM heat sink assembly 44.

Referring again to FIG. 1, CEC 10 includes a power supply 76 configured to supply direct current to power the various components within CEC 10. In an exemplary embodiment as illustrated, power supply 76 includes twelve DCAs configured to convert a high DC voltage to a lower DC voltage. The DCAs are depicted as power planes 56 in FIG. 7. Power supply 76 is disposed at a rear of CEC 10 adjacent to nodes 16 and on an opposite side of rear stiffener 54. A pair of lower blower assemblies 80 (only one shown in FIG. 1) are disposed beneath nodes 16 in CEC 10 while two upper blowers 82 are disposed above power supply 76 to exhaust air out the top rear indicated by flow arrow 84.

Each upper blower 82 is a field replaceable unit (FRU) having a single centrifugal impeller 86, a motor drive unit, and recirculation flaps at an exhaust thereof as is known in the art. Each lower blower assembly 80 is a field replaceable unit having a pair of centrifugal impellers 86 (not shown in FIG. 1) and a dual motor drive unit 88 to individually control the scroll blowers 86. Therefore, CEC 10 includes four lower scroll blowers and two upper scroll blowers for a total of six scroll blowers.

Upper blowers 82 pull upper airflow split 74 up into inlets 90 of upper blowers 82 after impingement on front stiffener 24. Lower blower assemblies 80 pull lower airflow split 72 down into inlets 90 of lower blower assemblies after impingement on front stiffener 24. The two upper blowers 82 draw air over vertical midplane 14 after exhausting through MCM heat sinks 44. The two upper blowers 82 ensure maximum airflow as well as symmetric cooling of the midplane. It will be recognized that since there are two more scroll blowers in a bottom potion of CEC 10 than in an upper portion thereof, a majority of horizontal airflow 70 splits into airflow split 72.

Referring now to FIGS. 9 and 10, left and right blower assemblies 80 with respect to their orientation in FIG. 1 are illustrated, respectively. Each blower assembly 80 includes a blower housing 100 that is substantially rectangular in shape. Blower housing includes a base 102 and an opposite top 104 defining a pair of air inlets 90 for each scroll blower 106. Housing 100 is further defined by four sides intermediate base 102 and top 104. A front side 110 defines a compartment for dual motor drive unit 88 while an opposite rear side 112 defines a rear exhaust opening 114 (FIG. 10) for a DCA blower or rear blower 120 proximate thereto. One of the opposing sides 116 includes a side exhaust opening 118 for auxiliary blower or front blower 122 proximate thereto.

Referring again to FIG. 1 in conjunction with FIGS. 9 and 10, lower airflow split 72 can be described in more detail. Lower airflow spit 72 is further split and flows into inlets 90 of each blower assembly 80. Rear blower 120 exhausts air indicated generally with rear airflow arrow 124 into an air plenum 126 disposed below power supply 76. Rear airflow 124 from the pair of rear blowers 120 exhaust through power supply 76 maximizing DCA airflow. Alternatively, or in addition to, airflow arrow 124 through power supply 76 may impinge upon a logic card generally indicated at 127 and exhaust from CEC 10 indicated with airflow arrow 128.

Figure 11:
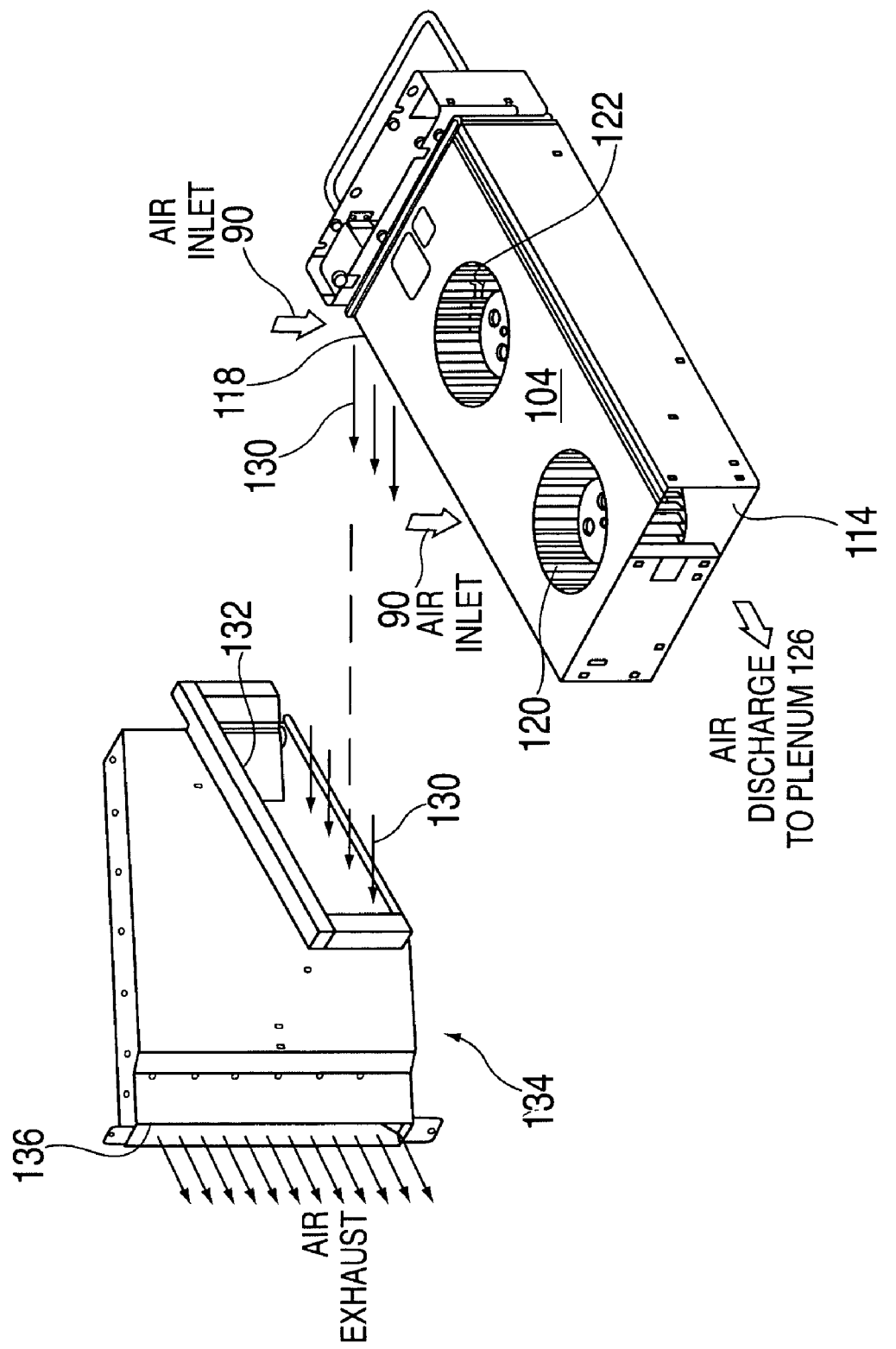
FIG. 11 is a perspective view of the right side blower assembly of FIG. 9 illustrating the side exhaust opening in fluid communication with a side exhaust duct.

Referring now to FIG. 1 in conjunction with FIG. 11, auxiliary blowers 122 disposed at the front of CEC 10 and each having left and right exhaust openings 118, respectively, exhaust airflow therefrom indicated generally with flow arrow 130 in FIG. 1. Exhaust opening 118 of each blower assembly 80 is in fluid communication with a corresponding inlet 132 of an exhaust side duct 134 configured to duct airflow 130 to a rear of CEC 10 via exhaust outlet 136 of side duct 134.

Figure 12:
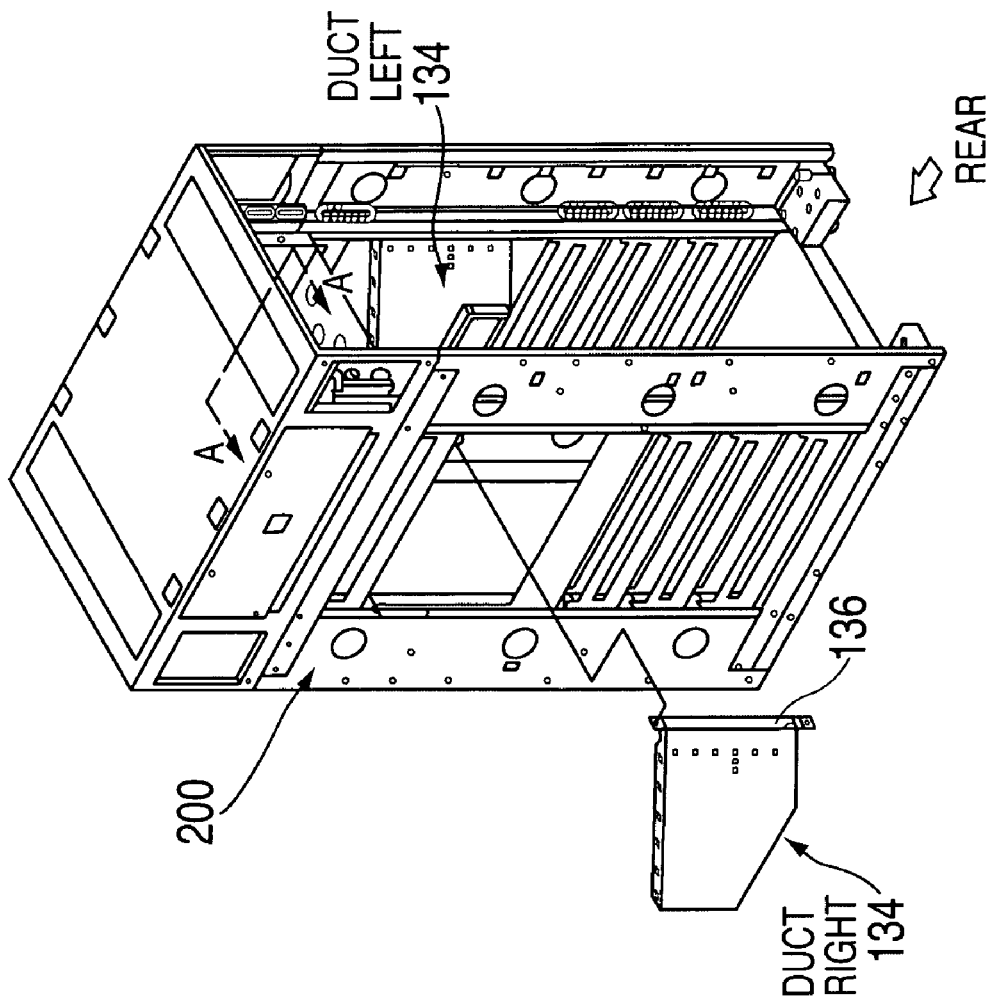
FIG. 12 is a rear perspective view of a frame assembly having a pair of the side exhaust ducts of FIG. 11 for exhausting air to a rear of the frame.

More specifically referring to FIG. 12, an exhaust side duct 134 is disposed on opposite sides (e.g., left and right sides) of a frame 200 to collect exhaust airflow 130 from a corresponding auxiliary blower 122 to exhaust air from side exhausts 118 to a rear of the CEC via exhaust outlets 136. In this manner, hot exhaust air is directed to a rear of the CEC instead of towards the front where cooling inlet airflow 70 initiates.

In an alternative embodiment, airflow 130 may be directed to air plenum 126 to further aid cooling of power supply 76 and further cool at least one logic card disposed thereabove.

Blower assemblies 80 are configured and positioned such that each of their inlets 90 are symmetrical, thus minimizing non-uniform flow through the nodes 16. In addition, it will be recognized that each auxiliary and DCA blower or scroll wheel are equally sized to aid in this purpose. Incorporating the side duct exhaust 118 facilitates equally sized scroll wheels in each blower assembly 80. In other words, housing 100 allows two blower wheels packaged in a single package, no wider than that required for a single blower, while forcing air in a direction from the front blower or auxiliary blower to the rear blower (e.g., DCA blower). No extra space is required or added to the width of housing 100 to accommodate a blower duct for the front blower (e.g., auxiliary blower). Both front and rear blower wheels of each blower assembly 80 are the same size and include corresponding ducts configured to duct exhaust air to a rear of the CEC 10.

Figure 13:
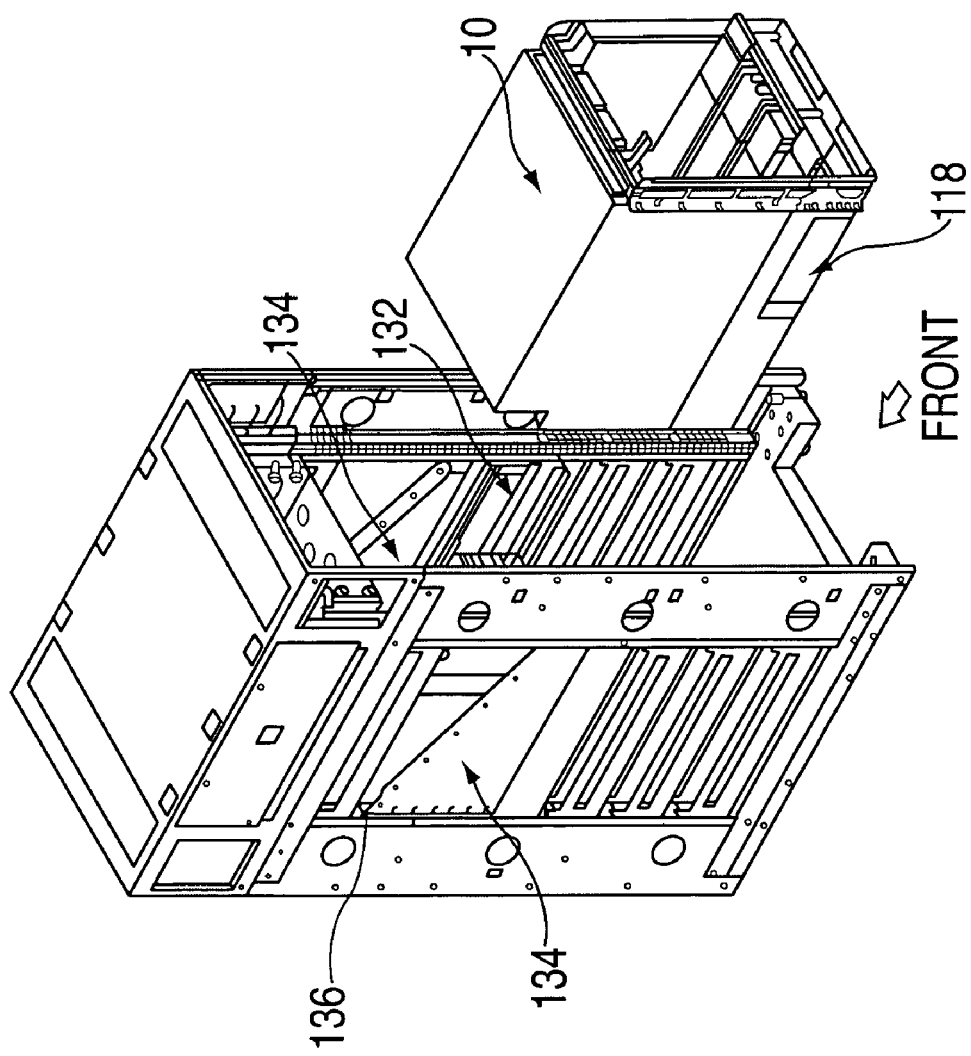
FIG. 13 is a front perspective view of the frame assembly of FIG. 12 accepting a CEC or cage in a front of the frame assembly.

FIG. 13 illustrates CEC 10 partially removed from a front of frame 200. CEC 10 illustrates a left side exhaust opening 140 aligned with exhaust side opening 118 of a left blower assembly 80 (not shown). Frame 200 illustrates inlet 132 to a right exhaust side duct 134 where the left side duct illustrates a portion of exhaust outlet 136. Here, it can be easily seen that airflow 130 from each auxiliary blower 122 exhausts to a rear of CEC 10 and frame 200, thus avoiding mixing hot exhaust air with cool inlet air 70 entering a front of CEC 10 and frame 200. It will also be pointed out that a bulk power assembly (BPA) is not shown in FIG. 13, however, BPA is disposed above CEC 10 when present. BPA converts line voltage to a DC voltage and provides the same to the DCAs.

It will be recognized by one skilled in the pertinent art that the forward mounted scroll wheels or auxiliary blowers 122 of each blower assembly 80 are reversed for optimized, balanced airflow to a rear of the CEC 10 where the power supply 76 is located. These reversed matched blowers enable maximum DCA airflow for cooling. The side ducts 134 each include a duct that gradually expands from inlet 132 to outlet 136 to minimize exhaust impedance. Optionally, exhaust air from side ducts 134 is partially redirected to cool logic cards 127 above power supply 76 which operate at warmer temperatures than the power supply exhaust air 128 (FIG. 1).

Figure 14:
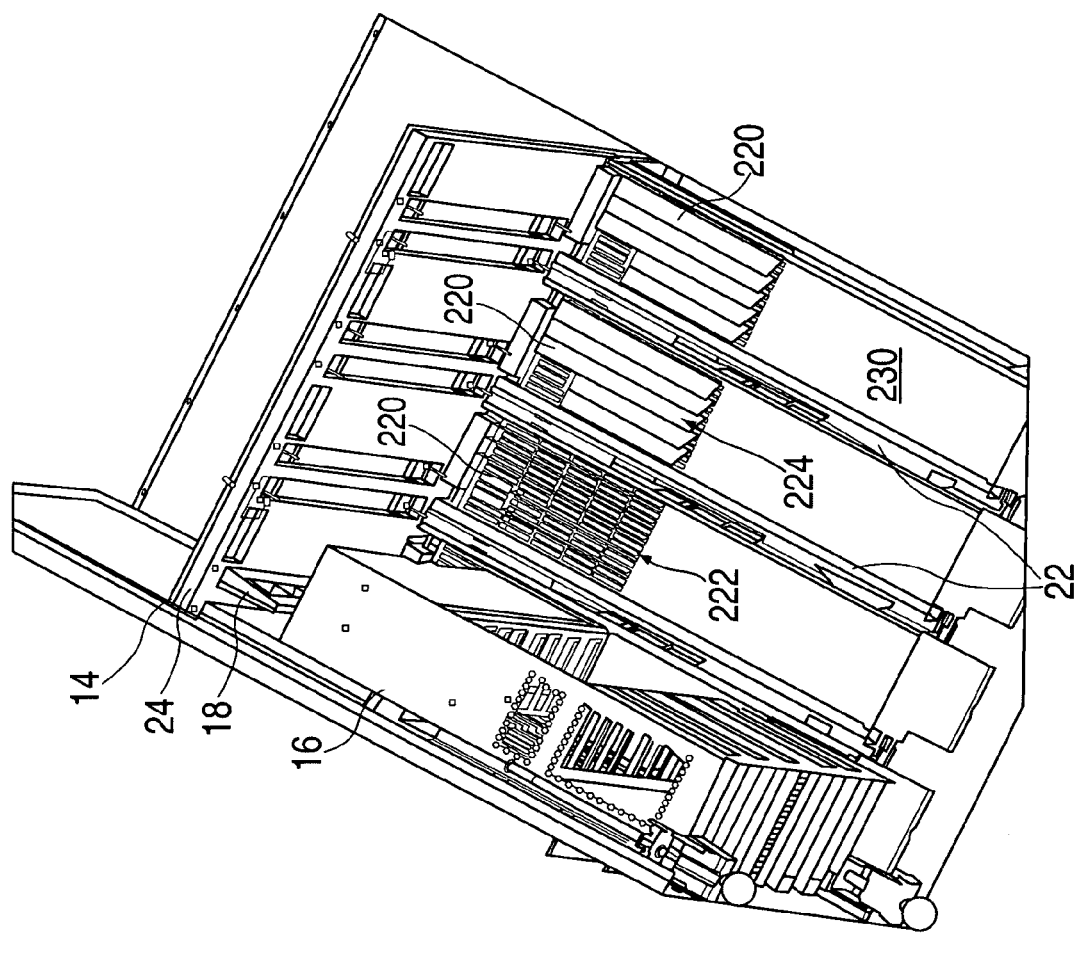
FIG. 14 is a top perspective view of the multiple card enclosure of FIG. 2 illustrating open and closed node actuated louvers positioned to align with vertically aligned MCM heat sink assemblies for each node.

Referring again to FIG. 2 in conjunction with FIG. 14 a plurality of louvers 220 are aligned with MCM heat sink assemblies 44 for each node or daughter card 16. Each set of plurality of louvers is disposed between a lower MCM heat sink assembly 44 and DCA blowers 120. Arrow 222 illustrates louvers 220 in an open position while arrow 224 illustrates louvers 220 in a closed position. Louvers 220 in an open position allow airflow split 72 to flow therethrough into inlets 90 of both DCA blowers 120 and auxiliary blowers 122. In this manner, when a node or card 16 is installed, corresponding louvers are open allowing split airflow 72 to flow through the lower MCM heat sink assembly 44 and convectively cool the associated MCM 40.

Referring now to FIG. 15, louvers 220 are shown in an open position. Louvers 220 are node actuated louvers in that the louvers 220 each pivot to the open position upon installation of a corresponding node 16 into CEC 10. Likewise, louver 220 pivot to the closed position upon removal of the corresponding node 16 from CEC 10. In other words, louvers 220 utilize node plugging and unplugging to actuate louvers corresponding to the node 16. More specifically, node actuated louvers 220 are disposed on a lower card guide between contiguous lower guide rails 22. A plurality of fingers 240 extend from a leading front lower edge 234 defining each node 16 configured to actuate respective louvers 220. Fingers 240 are fabricated of plastic, however, other suitable materials are also envisioned. Each finger 240 substantially defines a triangle having a leading tapered tip 242 configured to wedge beneath or pry up a corresponding leading edge 244 defining a corresponding louver 220. Each finger 240 is defined by contiguous roots 246 and tip 242 intermediate and opposite thereto. Root 246 receives leading edge 244 of a corresponding louver 220 therein when louver 220 is in a fully open position as illustrated in FIG. 14. Tip 242 is defined by a sloping edge 250 defining the triangle that extends from root 246 to tip 242. Sloping edge 250 facilitates pivoting of louver 220 either to an open position or a closed position depending upon translation of fingers 240 relative to leading edges 244 of louvers 220. Translation towards each other is limited to when leading edges 244 of louvers 220 abut a corresponding root 246. It will be noted that root 246 is further defined by an edge 252 defining a contiguous finger 240 and is parallel and substantially coaxial with a pivoting edge 254 of a louver 220 engaged therewith. It will be recognized that although louvers 220 have been described as being actuated with fingers 240 as described above in an exemplary embodiment, other finger 240 configurations and/or louver 220 configurations are contemplated that maintain the function of node actuated louvers although with different structure.

Louvers 220 operate as a recirculation flap enabling concurrent maintenance of the nodes. The prior art does not allow any of these nodes to be concurrently replaced while the machine is operating. The louvers under each of the logic nodes are closed when nodes are not present but are open upon the presence of a node. Thus, the node actuated louvers permit concurrent maintenance and node additions without special tools and shut down of the machine. In addition, the louvers maintain airflow over installed nodes when one or more nodes are removed. When a node is absent, a respective finger is disengaged from corresponding louvers and gravity closes the louvers. An air pressure differential on opposing surfaces of the louvers in the closed position helps to keep the louvers closed so that airflow can be directed where needed (e.g., to the inserted nodes instead of absent nodes).

While preferred embodiments have been shown and described, various modifications and substitutions may be made thereto without departing from the spirit and scope of the invention. Accordingly, it is to be understood that the present invention has been described by way of illustration and not limitation.

What is claimed is:

1. A system for airflow management in an electronic enclosure comprising:
   a backplane assembly, the backplane assembly comprising at least one backplane connector, a front stiffener and a mother card, the front stiffener intermediate the daughter card and the mother card;
   at least one daughter card, the daughter card including a daughter card connector configured to be removably connectable to the backplane connector, the daughter card oriented substantially perpendicular to the backplane assembly so that cooling air flows substantially parallel to the daughter card; and
   components disposed on the daughter card oriented to facilitate front-to-back airflow, wherein inlet cooling air impinges on the backplane assembly and splits into at least two flow portions flowing in different directions along a surface defining the backplane assembly.

2. The system of claim 1, wherein the different directions are both parallel to a surface defining the backplane assembly.

3. The system of claim 1, wherein the components include a pair of MCMs aligned in a vertical row proximate the backplane connector to minimize at least one of interconnect length, voltage drops, and signal delays.

4. The system of claim 3, wherein each MCM includes a thermal spreader intermediate a corresponding MCM cap and finned heat sink assembly.

5. The system of claim 4, wherein the at least two flow portions flowing in different directions are asymmetrical, the MCMs and corresponding thermal spreaders and finned heat sink assemblies are sized in proportion to the asymmetrical airflow distribution.

6. The system of claim 3, wherein the pair of MCMs are cooled in parallel as opposed to being cooled in serial.

7. The system of claim 1, wherein the backplane assembly is disposed in a vertical plane and the daughter card is disposed in one of a vertical and a horizontal plane.

8. The system of claim 1, wherein the front stiffener is made of aluminum.

9. The system of claim 1, wherein the backplane assembly includes a midplane board, the front stiffener intermediate the daughter card and the midplane board, wherein a thermally conductive, electrically isolating pad is located between the front stiffener and backside pins used to plug a power supply.

10. The system of claim 9, wherein the pins provide a low resistance thermal path from the midplane power planes and from the power supply connectors to the front stiffener via the thermally conductive, electrically isolating pad.

11. The system of claim 9, wherein the front stiffener includes impingement fins exposed to the inlet cooling air, the impingement fins configured to enhance a surface area of the front stiffener exposed to the impinging airflow.

12. The system of claim 1, wherein at least one of the airflow portions cools power supplies and at least one other exits the system at a rear thereof.

13. The system of claim 12, wherein at least one portion of the airflow flows up through at least one blower and exits the system while the at least one other portion flows down through at least one blower and cools the power supplies.

14. A central electronics complex comprising:
an enclosure;
a backplane assembly vertically disposed within the enclosure, the backplane assembly comprising at least one backplane connector;
at least one daughter card, the daughter card including a daughter card connector configured to be removably connectable to the backplane connector, the daughter card oriented substantially perpendicular to the backplane assembly so that cooling air flows substantially parallel to the daughter card;
at least one guide rail in operable communication to the enclosure and extending from the backplane, the guide rail facilitating installation and removal of the daughter card; and
components disposed on the daughter card oriented to facilitate front-to-back airflow, wherein inlet cooling air impinges on the backplane assembly and splits into at least two flow portions flowing in different directions along a surface defining the backplane assembly, the components including a pair of MCMs aligned in a vertical row proximate the backplane connector to minimize at least one of interconnect length, voltage drops, and signal delays.

15. The central electronics complex of claim 14, wherein each MCM includes a thermal spreader intermediate a corresponding MCM cap and finned heat sink assembly.

16. The central electronics complex of claim 15, wherein the at least two flow portions flowing in different directions are asymmetrical, the MCMs and corresponding thermal spreaders and finned heat sink assemblies are sized in proportion to the asymmetrical airflow distribution.

17. The central electronics complex of claim 14, further comprising node actuated louvers intermediate adjacent lower guide rails and aligned with each daughter card, each of the node actuated louvers configured to maintain airflow over installed daughter cards when one or more daughter cards are removed by closing the louvers when the daughter card is removed.

18. The central electronics complex of claim 17, wherein a plurality of fingers extend from a leading front lower edge defining each daughter card, the fingers configured to actuate respective louvers, opening these louvers so that airflow may exit the daughter card and enter a blower inlet plenum.

19. The central electronics complex of claim 18, wherein each finger substantially defines a triangle having a leading tapered tip configured to pry up a corresponding leading edge defining a corresponding louver into an open position.

20. An airflow management system for a computer comprising:
a frame;
a central electronics complex enclosure housed within the frame;
a backplane assembly vertically disposed within the enclosure, the backplane assembly comprising at least one backplane connector;
multiple daughter cards, each daughter card including a daughter card connector configured to be removably connectable to the backplane connector, each daughter card oriented substantially perpendicular to the backplane assembly so that cooling air flows substantially parallel to each daughter card;
at least one guide rail in operable communication to the enclosure and extending from the backplane, the guide rail facilitating installation and removal of each daughter card; and
components disposed on each daughter card oriented to facilitate front-to-back airflow, wherein inlet cooling air impinges on the backplane assembly and splits into at least two flow portions flowing in different directions along a surface defining the backplane assembly, the components including a pair of MCMs aligned in a vertical row proximate the backplane connector to minimize at least one of interconnect length, voltage drops, and signal delays.

21. The system of claim 20, wherein each MCM includes a thermal spreader intermediate a corresponding MCM cap and finned heat sink assembly.

22. The system of claim 21, wherein the at least two flow portions flowing in different directions are asymmetrical, the MCMs and corresponding thermal spreaders and finned heat sink assemblies are sized in proportion to the asymmetrical airflow distribution.

23. The system of claim 20, wherein at least one of the airflow portions cools secondary air-cooled structures and at least one other exits the system at a rear thereof.

24. The system of claim 23, wherein the at least one portion of the airflow flows up through at least one blower and exits the system while the at least one other portion flows down through at least one blower and cools the secondary air-cooled structures.

25. The system of claim 24, wherein the secondary air-cooled structures include at least one of a power supply and other cards disposed in the enclosure.

26. The system of claim 25, wherein the at least one other portion flows down through at least one blower and first cools the power supply and then any cards disposed above the power supply before exiting a rear of the system.

27. The system of claim 20, wherein the daughter card is a processor card assembly.

* * * * *